(12) United States Patent
Oetelaar et al.

(10) Patent No.: US 7,989,778 B2
(45) Date of Patent: Aug. 2, 2011

(54) CHARGED-PARTICLE OPTICAL SYSTEM WITH DUAL LOADING OPTIONS

(75) Inventors: Johannes Antonius Maria Van Den Oetelaar, Eindhoven (NL); Jorn Hermkens, Oss (NL); Pleun Dona, Veldhoven (NL); Frank Nederlof, Nuenen (NL); Wim Wondergem, Best (NL)

(73) Assignee: FEI Company, Hillsboro, OR (US)

( * ) Notice: Subject to any disclaimer, the term of this patent is extended or adjusted under 35 U.S.C. 154(b) by 142 days.

(21) Appl. No.: 12/608,380

(22) Filed: Oct. 29, 2009

(65) Prior Publication Data

US 2010/0108907 A1 May 6, 2010

(30) Foreign Application Priority Data

Oct. 31, 2008 (EP) .................................. 08168121

(51) Int. Cl.
*H01J 37/20* (2006.01)
*G01N 35/10* (2006.01)

(52) U.S. Cl. ......... 250/442.11; 250/440.11; 250/441.11; 977/854; 310/12.01

(58) Field of Classification Search .................. 250/306, 250/307, 309–311, 440.11, 441.11, 442.11; 310/12.01; 977/854
See application file for complete search history.

(56) References Cited

U.S. PATENT DOCUMENTS

| | | | |
|---|---|---|---|
| 5,001,350 A | 3/1991 | Ohi et al. | |
| 5,986,270 A | 11/1999 | Bormans et al. | |
| 6,717,156 B2 * | 4/2004 | Sugaya et al. | 250/440.11 |
| 7,034,316 B2 | 4/2006 | Wagner et al. | |
| 7,291,847 B2 | 11/2007 | Morrison | |
| 7,573,047 B2 * | 8/2009 | Suzuki | 250/442.11 |
| 2008/0073562 A1 * | 3/2008 | Suzuki | 250/440.11 |
| 2008/0173813 A1 | 7/2008 | Van de Water et al. | |
| 2008/0250881 A1 | 10/2008 | Dona | |
| 2008/0283768 A1 * | 11/2008 | van Gaasbeek et al. | 250/442.11 |
| 2009/0146075 A1 | 6/2009 | Schmid et al. | |

FOREIGN PATENT DOCUMENTS

| JP | 2001-100038 | 4/2006 |
|---|---|---|
| WO | 2008051880 | 5/2008 |

\* cited by examiner

*Primary Examiner* — Bernard E Souw
(74) *Attorney, Agent, or Firm* — Scheinberg & Griner, LLP; Michael O. Scheinberg; David Griner

(57) ABSTRACT

A charged-particle optical system (100) such as an electron microscope has a vacuum chamber (102) with a space (104) for accommodating a specific one (114) of multiple specimens in operational use. The charged-particle optical system has a loader (106) with a part (108) that is moveable into and out of the space. The part is configured for attaching a specimen carrier (110), brought from outside the system, to a first holder (112) or to detach the carrier from the first holder and to remove the carrier from inside the system. The carrier accommodates a first specimen. The system has an interface (116) in a wall of the chamber for removably accommodating the first holder (112) or a second holder (118) with a second specimen (120) mounted thereon.

6 Claims, 3 Drawing Sheets

CHARGED-PARTICLE OPTICAL SYSTEM WITH DUAL LOADING OPTIONS

FIELD OF THE INVENTION

The invention relates to a charged-particle optical system and to a loader for loading a specimen carrier into the system.

BACKGROUND ART

Charged-particle optical systems are well known, highly specialized tools for illuminating a specimen with charged particles, e.g., electrons or ions in order to create an image or to modify a surface of the specimen. Different configurations of such tools are referred to by their respective names in the jargon, such as Transmission Electron Microscopes (TEMs), Scanning Electron Microscopes (SEM), Reflection Electron Microscopes (REMs), Scanning Transmission Electron Microscopes (STEMs), Focused Ion Beam apparatus, etc. The compartment wherein the specimen is being illuminated is kept evacuated to a sufficiently low pressure so as to prevent the charged particles from being scattered. Electromagnetic or electrostatic lenses are used to control and collimate the charged-particle beam. The specimen is placed, typically accommodated on a carrier, on a specimen holder that extends through the wall of the charged-particle optical system in order to hold the specimen at the required position with respect to the beam. The specimen holder has an end at which the specimen is located, referred to as the "specimen holder tip".

Some charged-particle optical systems have specimen holders that enable to vary, in situ, the position of the tip and/or the orientation of the tip with respect to the stationary holder so as to be able to make a series of images of the specimen, e.g., for a three-dimensional model of the specimen. The specimen is mounted on the tip when the holder is removed from the charged-particle optical system. For example, U.S. Pat. No. 7,291,847, incorporated herein by reference, discloses a TEM with a specimen tip holder assembly for mounting a specimen tip in the TEM. The specimen tip holder assembly comprises a tip holder for supporting a specimen tip. The tip holder is coupled to an elongate support for movement in a direction substantially perpendicular to the axis of the support. An actuator is mounted to the support for causing motion of the tip holder relative to the support. By means of bonding the specimen to the specimen tip rather than using clips or other mechanical fixing means, the size of the specimen tip may be significantly reduced. Indeed, the need for any sort of specimen clamping or locating mechanism is eliminated thus allowing a much thinner tip profile to fit between the narrow gap of the TEM pole pieces. Once bonded, the individual specimens can be handled and stored as an assembly with an interchangeable specimen tip.

Yet other charged-particle optical systems have been specially designed for cryogenic applications, e.g., the study of biological specimens. In such a system the specimen to be studied is cooled down to the temperature of, e.g., liquid nitrogen or liquid helium and mounted at the specimen holder tip.

In order to keep the specimen at the required low temperature, one configuration of such a system has a cooling device mounted at the specimen holder and in thermal contact with the specimen. This configuration, however, has the disadvantage that the entire specimen holder has to be removed from the system for replacing the specimen at the specimen holder tip. The replacement of the specimen may not be carried out at the same low temperature during operational use. As a result, upon reintroducing the specimen holder with the new specimen into the system, the entire system is not in thermal equilibrium, giving rise to thermal drift of the specimen relative to the electron beam, adversely affecting the image quality. Accordingly, the system has to reach thermal equilibrium before high-quality images can be made, thus reducing the time wherein the system is available for operational use.

U.S. Pat. No. 5,986,270, incorporated herein by reference, discloses a configuration of an electron microscope for cryogenic applications. Herein, the specimen holder is retained in a fixed position in the evacuated compartment during normal operation of the electron microscope. The specimen holder has a control unit, accessible from outside the electron microscope, for translating and rotating the specimen holder. The specimen is brought to the holder via a loading/unloading unit that is mounted separately from the specimen holder and that is configured for transporting the specimen to and from the specimen holder. The loading/unloading unit is mounted in a wall of the electron microscope in the vicinity of the location where the specimen holder is arranged, i.e. preferably at the same height in the wall of the column of the electron microscope and diametrically opposite the specimen holder. The object space accommodating the specimen in operational use of the electron microscope also accommodates a part of a loading/unloading unit. The location of the loading/unloading unit offers the advantage that it is not necessary to modify the design of the apparatus, notably the optical aspects thereof, because the location of the optical elements in the particle-optical column is not influenced thereby. The loading/unloading unit transfers the specimen into and out of the evacuated space within the column of the electron microscope and transports the specimen to and from the specimen holder within said space. The specimen itself need not yet have reached the desired final temperature, because it consists of only a small quantity of matter to be cooled, so that it has a small heat capacity and can be readily cooled, not causing noticeable heating of the specimen holder. The specimen to be studied is introduced into the loading/unloading unit from, after which the specimen is transferred into the object space in a known manner (for example, as in the case of conventional specimen holders); it is then situated at an end of an arm of the loading/unloading unit. The end of the specimen holder is subsequently brought into contact with the end of the arm of the loading/unloading unit in order to take over the specimen. During the transfer of the specimen from the loading/unloading unit to the specimen holder the thermal contact between the end of the specimen holder and the corresponding end of the loading/unloading unit can be limited by providing thermal insulation of a transfer arm of the loading/unloading unit and/or by constructing this arm to be thin and/or by limiting the duration of the contact. It will thus be evident that the specimen holder itself is not removed from the apparatus in order to exchange the specimen. Actually, the specimen holder cannot be removed during normal operation of the system without major servicing of the system. The cooling conduit means are provided separately between the end of the specimen holder which is situated inside the apparatus and the cold source. The term "separately" in this context is to be understood to mean that the cooling conduit means is not connected to the specimen holder in any way other than the connection to the end of the specimen holder. As a result, cooling takes place where cooling is indeed most desirable, i.e. in the direct vicinity of the specimen.

US patent application publication 2008/0250881, incorporated herein by reference, relates to a specimen holder suitable for being used with a replaceable specimen carrier. More specifically, US patent application publication 2008/0250881 relates to a composite structure of a specimen carrier and a specimen holder. The specimen carrier is separately embodied from the sample holder. The specimen carrier can be formed from a strip of metal, and is a simple and inexpensive element. Using resilient force, it clamps onto or into the specimen holder. The portion of the specimen holder to which the specimen carrier couples also has a simple form. The specimen carrier can couple to the specimen holder in vacuum using a coupling tool. In an embodiment of the cooperative composite structure the coupling tool is an automatic coupling tool. An automatic coupling tool makes it possible to automate processes, and it also makes it possible to attach the sample carrier to a sample holder in vacuum. The latter is of particular importance in so-called cryogenic applications, where a sample carrier that has already been pre-cooled has to be attached to a sample holder at cryogenic temperatures, e.g. temperatures in the vicinity of that of liquid nitrogen or of liquid helium. Systems configured for use with replaceable specimen carriers are also highly relevant for (automated) processing of a batch of specimens, each accommodated on a different carrier.

In a further embodiment, coupling of the specimen carrier to the specimen holder or decoupling of the specimen carrier from the specimen holder occurs in vacuum. The vacuum may be part of a TEM, a STEM, a SEM, an Electron Microprobe Analyzer (EPMA), a Focused Ion Beam apparatus (FIB), an Auger analyzer, a Secondary Ion Mass Spectrometer (SIMS), a Scanning Probe Microscope (SPM), an X-ray analyzer, a sputter coater, a plasma cleaner or an evaporative deposition unit.

SUMMARY OF THE INVENTION

The space available for positioning the specimen holder tip within the charged-particle optical system is very small, typically with a characteristic dimension in the order of 5 mm. Specimen holders should also be mechanically very stable in order to allow an image resolution of, e.g., 0.1 nm or less. The publications briefly discussed above demonstrate that a specimen holder assembly is typically designed for a particular type of usage. For example, the design of a specimen holder for use in a cryogenic application is based on certain considerations with respect to thermal criterions, e.g., being made of suitable materials, using joints and lubricants for controlling the position and orientation of the specimen holder tip that function properly at low temperatures. As another example, a specimen holder for use at high temperatures, e.g., 500 K, put some other demands on the materials and joints. As yet another example, a specimen holder may be configured for acceptance of a replaceable cartridge carrying the specimen. As yet another example, specimen holders are available that enable their specimen holder tip to be adjusted relative to the holder, e.g., with respect to the tip's position and/or orientation (tilting with one or more degrees of freedom). This needs intricate machinery at the tip. All this shows that specimen holder assemblies for charged-particle optical systems are expensive components.

The inventors have realized that loading a specimen into a charged-particle optical system is generally a delicate process. The specimen has to be mounted on a specimen holder. The specimen can be damaged during mounting and/or during the loading of the holder into the charged-particle optical system.

The inventors have also realized that the configurations of known charged-particle optical systems restrict the usage of specimen holders to only particular types. U.S. Pat. No. 5,986,270 discloses a specimen holder mounted in an electron microscope and a transport unit that arranges the specimen on the specimen holder. The specimen holder is to be moved towards the transport unit in order to accept the specimen, and is then to be moved back to the position for operational use of the electron microscope. Owing to the amount of space available for maneuvering, as a result of part of the transport unit and part of the cooling means extending into the object space, the setup disclosed in U.S. Pat. No. 5,986,270 is not suitable for replacing specimens by means of replacing specimen holders. Also, U.S. Pat. No. 5,986,270 is not suitable for replacing specimens by means of replacing the specimen holder, as the removal and re-insertion interferes with thermal equilibrium requirements, discussed above. U.S. Pat. No. 7,291,847, on the other hand, restricts the usage to specimen holders that have the specimen already bonded to the tip. In order to replace the specimen, the specimen holder must be removed from the electron microscope and either the specimen is to be mechanically or chemically removed from the tip, or the tip is to be replaced. After bonding the new specimen to the tip, the specimen holder can be re-inserted into the electron microscope for a new operational cycle.

The inventors therefore propose a more convenient configuration of a charged-particle optical system suitable for replacing specimens using an in situ specimen holder configured for accepting a cartridge with a specimen, and for replacing specimens using a holder that is removed in its entirety.

More specifically, the invention relates to a charged-particle optical system comprising an evacuable chamber with a space for accommodating a specific one of multiple specimens in operational use of the charged-particle optical system. The system has a loader, which includes guiding means for controllably guiding a part into and out of the space. The part is configured for enabling to attach a carrier, brought from outside the chamber, to a first specimen holder or to detach the carrier from the first specimen holder and to remove the carrier from inside the chamber. The carrier is configured for accommodating a first one of the specimens. The system also has an interface in the chamber for removably accommodating and positioning, in operational use of the system, the first specimen holder or a second specimen holder with a second one of the specimens mounted thereon.

Accordingly, the charged-particle optical system in the invention allows loading a specimen on a cartridge or other carrier that has to be attached to a holder already in place in the system, as well as loading a specimen already mounted on a holder by means of placing the holder. Changing between these types of holders does not require additional service actions from the operator. The system in the invention thus maintains its operational flexibility in that it can be used to support all types of experiments at high specimen temperatures, at low specimen temperatures, using straining the specimen, etc. Note that in the electron microscope disclosed in U.S. Pat. No. 5,986,270 the specimen holder moves to or from the loader unit, whereas in the invention the loader accommodates a part that moves to the stationary holder or away from the stationary holder. The cartridge loading cycle in the invention does therefore not interfere with positioning the holder.

In an embodiment of the system of the invention, the loader comprises a vacuum load lock, and the part comprises a gripper. As known, a vacuum load lock enables to bring objects into or out of the chamber while preserving the vacuum. The guiding means is configured to guide the gripper when moving to attach or detach the carrier. The system has means for mechanically engaging the vacuum load lock and the gripper so as to allow locking the gripper in a retracted position inside the system or chamber and outside the space.

In a further embodiment, the means comprises a key and a guiding channel matching the key. The key is positioned on one of the gripper and the vacuum load lock, and the guiding channel is positioned in the other one of the gripper and the vacuum load lock.

The invention further relates to a loader for use in a charged-particle optical system as specified above.

BRIEF DESCRIPTION OF THE DRAWING

The invention is explained in further detail, by way of example and with reference to the accompanying drawing, wherein.

Throughout the Figures, similar or corresponding features are indicated by same reference numerals.

DETAILED EMBODIMENTS

Figure 1:
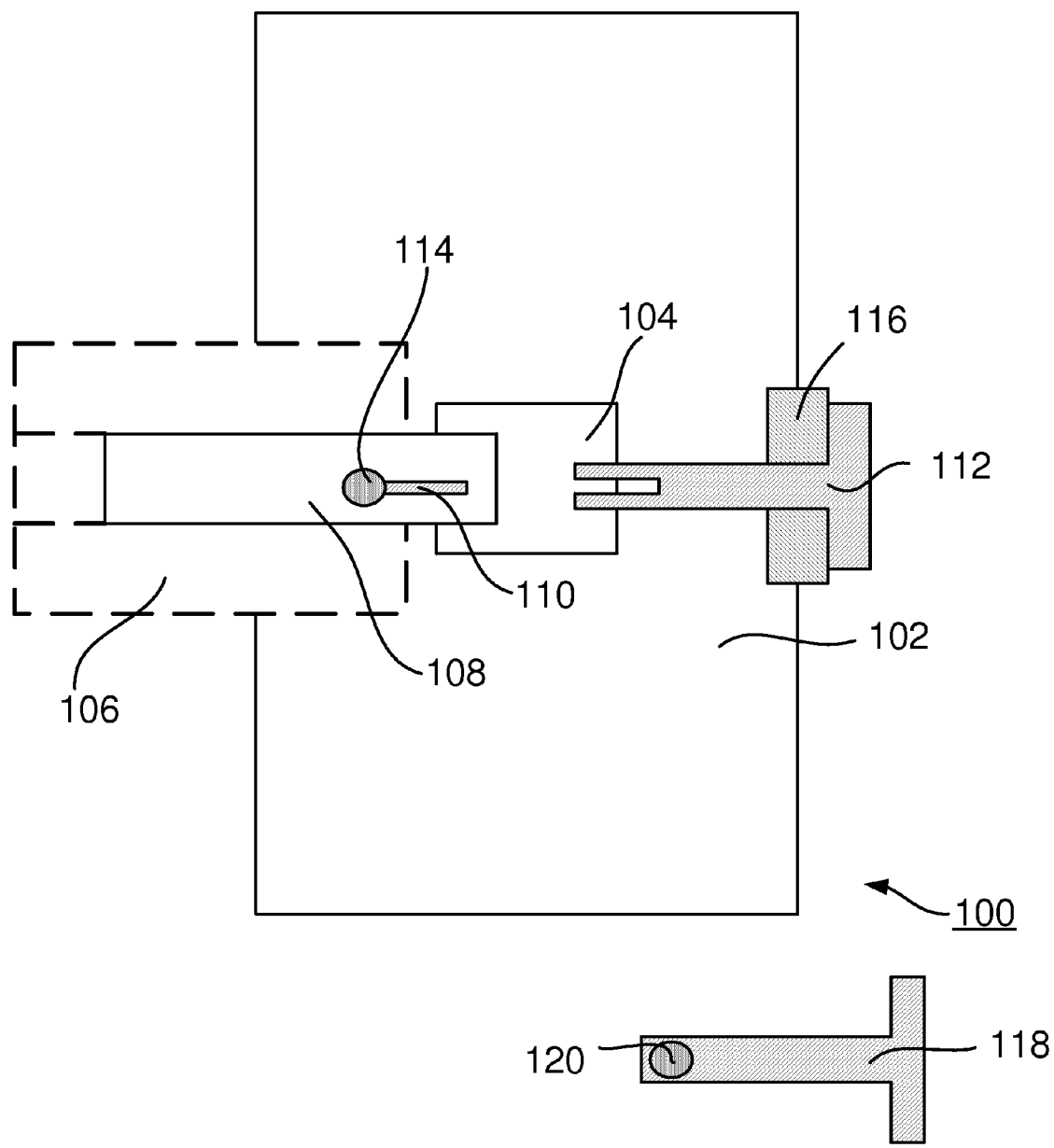
FIG. 1 is a block diagram of a charged-particle optical system in the invention.

FIG. 1 is a block diagram of a charged-particle optical system 100 of the invention. As charged-particle optical systems are well known in the art, FIG. 1 only shows those components that are relevant to the current invention.

Charged-particle optical system 100, e.g., a TEM or a STEM, comprises an evacuable chamber 102, coupled to vacuum pump (not shown) and having a space 104 for accommodating a specific one of multiple specimens in operational use of charged-particle optical system 100. System 100 also has a loader 106. Loader 106 accommodates a part 108 that is moveable into and out of space 104. Part 108 is configured for enabling to attach a carrier 110, brought from outside charged-particle optical system 100, or from outside chamber 102, to a first specimen holder 112 or to detach carrier 110 from first specimen holder 112 and remove carrier 110 from inside chamber 102, or from inside system 100. Carrier 110 is configured for accommodating a first one 114 of the specimens. System 100 further has an interface 116 in chamber 102 for removably accommodating first specimen holder 112 or a second specimen holder 118 with a second one 120 of the specimens mounted thereon.

Second specimen holder 118 preferably resembles a standard side-entry TEM specimen holder as known to the person skilled in the art, showing tilt, double tilt, rotation, heating, or other capabilities, although a specimen holder of a different kind may be used.

Accordingly, system 100 can operate in a first mode, wherein first specimen 114 is mounted via loader 106 onto first specimen holder 112 in situ, and in a second mode, upon replacing holder 112 by holder 118, wherein second specimen 120 is loaded together with placing loader 118. Note that part 108 is moveable into space 104 and out of space 104. When part 108 has moved into space 108, carrier 110 can be attached to, or separated from, holder 112, whereupon part 108 can be retracted from space 104. If holder 118 is used instead of holder 112, part 108 is kept out of harms way, thus maximizing the room to maneuver holder 118 that may have a tip end that occupies slightly more space than the tip end of holder 112.

In this way a charged-particle optical system 100 according to the invention combines all capabilities of system using a standard side entry TEM sample holder and the capabilities of cassette loading via samples mounted on small tips that are introduced with a gripper and coupled to a first specimen holder, acting as a receiver of said tips on which the specimens are mounted.

Figure 2:
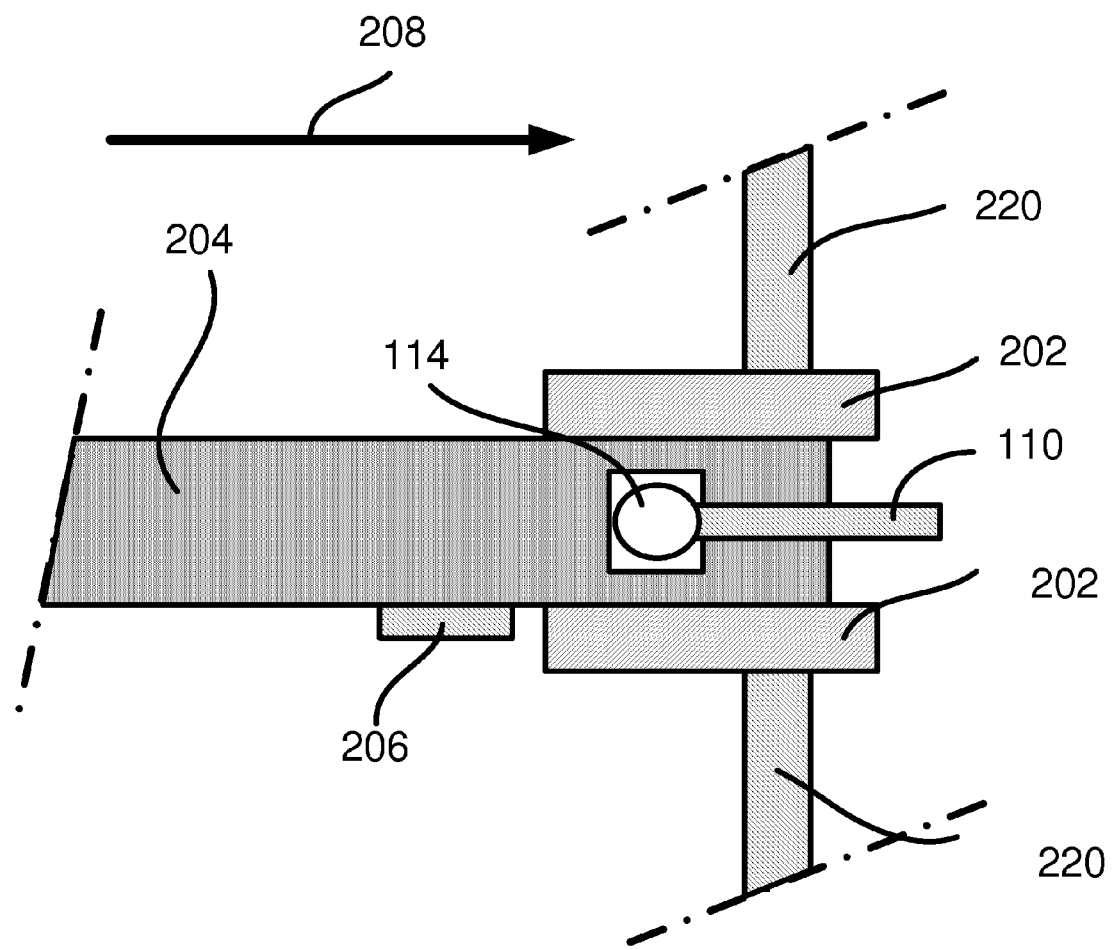
FIGS. 2, 3 and 4 are block diagram illustrating a loader in the invention.

FIG. 2 is a block diagram of loader 106 in the invention, represented in cross-section. The evacuable chamber 102 shown in FIG. 1 has a wall 220. Loader 106 comprises a vacuum load lock 202. Part 108 comprises a gripper 204 that is keyed with key 206 to vacuum load lock 202. Vacuum load lock 202 enables to use gripper 204 for loading carrier 110 with specimen 114 into charged-particle optical system 100 in order to attach carrier 110 to holder 112 (when moving the gripper in the direction of arrow 208) or for removing carrier 110 from holder 112 (when moving in the direction opposite to arrow 208) and from charged-particle optical system 100. Gripper 204 can be manually controlled, or using suitable actuators known from robotics, can be automatically controlled by a computer or microcontroller. Carrier 110 and holder 112 are designed according to, e.g., the approach disclosed in US patent application publication 2008/0250881, discussed above, or another suitable approach that enables to mechanically match carrier 110 with holder 112 using gripper 204 Preferably, vacuum load lock 202 preserves the vacuum in space 104 during the loading and unloading of carrier 110.

The keying of vacuum load lock 202 and gripper 204 is preferably such that gripper 204 can only be loaded into, or removed from, vacuum load lock 202 in a certain orientation relative to vacuum load lock 202, so as to avoid erroneously loading another gripper with a another carrier and another specimen while a gripper and/or carrier 110 with specimen 114 are still inserted in the instrument and coupled to holder 112. To that end, after attaching carrier 110 to holder 112, gripper 204 is retracted into vacuum load lock 202 and can stay there for the duration of the experiment conducted on specimen 114, being positioned so as to not interfere with the electron beam or with holder 112 when the latter has the orientation changed of its tip so as to tilt specimen 114 with respect to the direction of the electron beam.

Figure 3:
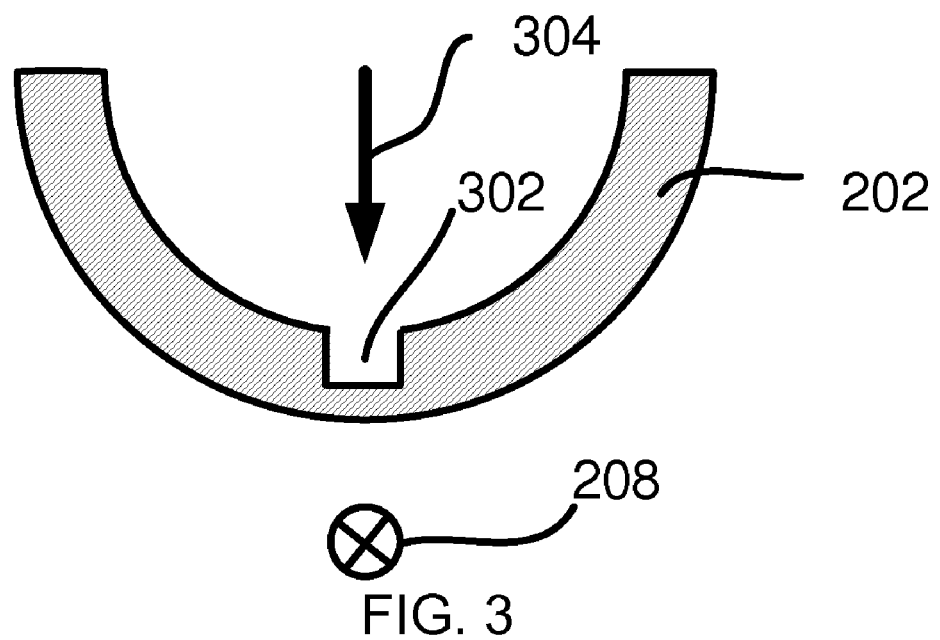
Figure 4:
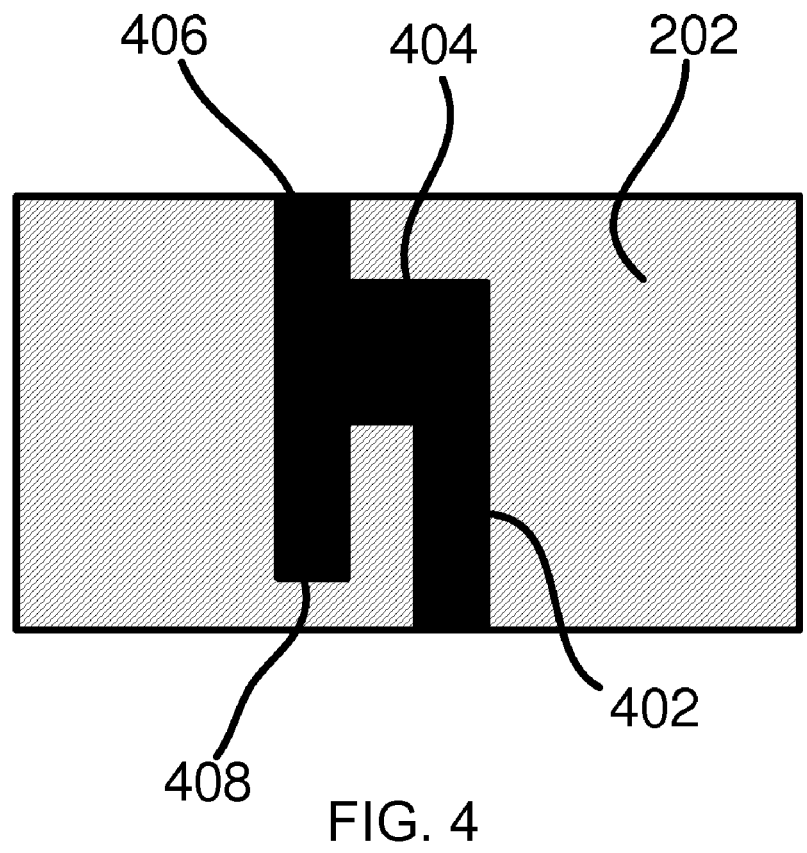

FIGS. 3 and 4 are diagrams that illustrate, in combination with FIG. 2, a simple keying mechanism. Gripper 204 has a key 206 whose shape and dimensions match with a profiled guiding channel 302 in vacuum load lock 202. Channel 302 guides gripper 204 and locks gripper 204 in a retracted position. To clarify the operation, assume that gripper is to be brought into system 100 via vacuum load lock 202. Arrow 208 in FIG. 2 indicates the direction of moving gripper 204. FIG. 3 is a diagram showing a lower half portion of vacuum load lock 202 when looking at vacuum load lock 202 face on from outside system 100 as indicated by the tail of arrow 208 in FIG. 3. FIG. 4 is a diagram showing the inner surface of vacuum load lock 202 when looking at vacuum load lock 202 from the direction indicated by arrow 304 in FIG. 3. In the view of FIG. 4, channel 302 has a first portion 402 that guides key 206 so as to move gripper 204 first in the direction of arrow 208. Then, gripper 204 is to be kept in position and rotated clockwise around its longitudinal axis so as to move key via a portion 404 to a portion 406. Once key 206 has entered portion 406, gripper 204 can be moved further in the direction of arrow 208 so as to attach carrier 110 to holder 112. Once carrier 110 is thus mounted, gripper 204 is retracted in a direction opposite to the one of arrow 208, i.e., outwards from charged-particle optical system 100. Channel 302 has a portion 408 to hold key 206 in a position, wherein gripper 204 is retracted and locked in vacuum load lock 202.

FIGS. 2, 3 and 4 merely serve to illustrate an example of keying gripper 204 to vacuum load lock 202. It is clear to the skilled person that channels with other profiles can be used with a matching key, and also that the guidance channel can be made in the outer surface of gripper 204 while the key is accommodated in vacuum load lock 202.

Note that, once gripper 204 is locked in channel portion 408, gripper can only be released by moving in the direction of arrow 208, i.e., towards the inside of charged-particle optical system 100. This facilitates picking up carrier 110 from holder 112 when the experiments on specimen 114 have been completed, and specimen 114 can be removed or replaced by another specimen. The profile of channel 302 can be designed in such a way, that gripper 204 must pick up carrier 110 from holder 112 in order to remove gripper 204 altogether from system 100 (preferably via a vacuum lock, not shown). This configuration prevents another carrier (not shown) from being loaded accidentally when carrier 110 is still attached to holder 112. Also note that when gripper 204 is locked in the retracted position in portion 408, gripper 204 does not interfere with the electron beam or with any controlled movements of the tip of holder 112 or the tip of holder 118 that position or orientate specimen 114 and specimen 120, respectively, with regard to the electron beam.

Vacuum load lock 202 is positioned so as to have gripper 204 move and be positioned into space 104 opposite of interface 116 so as to be aligned with holder 112 when mounted at interface 116. Note that system 100 can still be used in a scenario, wherein replacing specimen 120 in space 104 involves removing holder 118 to which specimen 120 is attached.

We claim the following:

1. A loader for use with a charged-particle optical system, the system comprising:
   an evacuable chamber with a space for accommodating a specific one of multiple specimens in operational use of the system, wherein:
   the loader has guiding means for controllably guiding a part into and out of the space:
   the part is configured for enabling to attach a carrier, brought from outside the chamber, to a first specimen holder or to detach the carrier from the first specimen holder and to remove the carrier from inside the chamber, and
   the carrier is configured for accommodating a specific one of the specimens.

2. The loader of claim 1, wherein:
   the loader comprises a vacuum load lock;
   the part comprises a gripper;
   the vacuum load lock is configured to guide the gripper when moving to attach or detach the carrier; and
   the guiding means has engaging means (206, 302, 408) for mechanically engaging the vacuum load lock and the gripper so as to allow locking the gripper in a refracted position inside the system and outside the space.

3. The loader of claim 2, wherein:
   the engaging means comprises a key and a guiding channel matching the key; and
   the key is positioned on one of the gripper and the vacuum load lock, and the guiding channel is positioned in the other one of the gripper and the vacuum load lock.

4. The loader of claim 1, wherein the system further comprises:
   an interface in a wall of the chamber for removably accommodating and positioning, in operational use of the system, the first specimen holder or a second specimen holder with a second one of the specimens mounted thereon.

5. The system of claim 4, wherein:
   the loader comprises a vacuum load lock;
   the part comprises a gripper;
   the guiding means is configured to guide the gripper when moving to attach or detach the carrier; and
   the guiding means has engaging means for mechanically engaging the vacuum load lock and the gripper so as to allow locking the gripper in a refracted position inside the system and outside the space.

6. The system of claim 5, wherein:
   the engaging means comprises a key and the guiding means comprises a guiding channel matching the key; and
   the key is positioned on one of the gripper and the vacuum load lock, and the guiding channel is positioned in the other one of the gripper and the vacuum load lock.

* * * * *